(12) United States Patent
Hasegawa et al.

(10) Patent No.: US 7,099,783 B2
(45) Date of Patent: Aug. 29, 2006

(54) SEMICONDUCTOR INTEGRATED CIRCUIT, DESIGN SUPPORT APPARATUS, AND TEST METHOD

(75) Inventors: Tetsu Hasegawa, Kawasaki (JP); Kenichi Anzou, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 9 days.

(21) Appl. No.: 10/426,657

(22) Filed: May 1, 2003

(65) Prior Publication Data

US 2003/0229886 A1  Dec. 11, 2003

(30) Foreign Application Priority Data

May 8, 2002  (JP) ............... 2002-133186

(51) Int. Cl.
*G06F 9/44* (2006.01)
(52) U.S. Cl. .................................... 702/57
(58) Field of Classification Search ............ 702/57, 702/119; 714/726, 728, 724, 733, 33, 718, 714/732, 30, 25; 326/16; 341/16, 102; 324/73; 73/865; 370/449, 448; 118/50; 717/115; 365/201
See application file for complete search history.

(56) References Cited

U.S. PATENT DOCUMENTS 4,000,460 A * 12/1976 Kadakia et al. ............ 714/726

5,138,619 A * 8/1992 Fasang et al. ............. 714/718

FOREIGN PATENT DOCUMENTS

| JP | 5-87888 | 4/1993 |
|---|---|---|
| JP | 6-51022 | 2/1994 |
| JP | 11-202026 | 7/1999 |

* cited by examiner

*Primary Examiner*—John Barlow
*Assistant Examiner*—Tung S. Lau
(74) *Attorney, Agent, or Firm*—Oblon, Spivak, McClelland, Maier & Neustadt, P.C.

(57) ABSTRACT

A semiconductor integrated circuit includes a self-testing circuit having a test circuit which is incorporated in a logic circuit to test the logic circuit. The test circuit has a test pattern generator to generate a test pattern and a compressor to compress a test result output. The logic circuit includes a plurality of scan chains including a plurality of serial connected registers and the compressor includes a through output portion. The semiconductor integrated circuit also includes a pattern counter which counts the test pattern at a test time of the logic circuit, a shift counter which counts the number of shifts in the scan chain in the logic circuit at the test time, and a failure information output circuit which is connected to the test circuit and which outputs step information of the test pattern corresponding to a failure to an integrated circuit external terminal when the failure is detected at the test time.

8 Claims, 10 Drawing Sheets

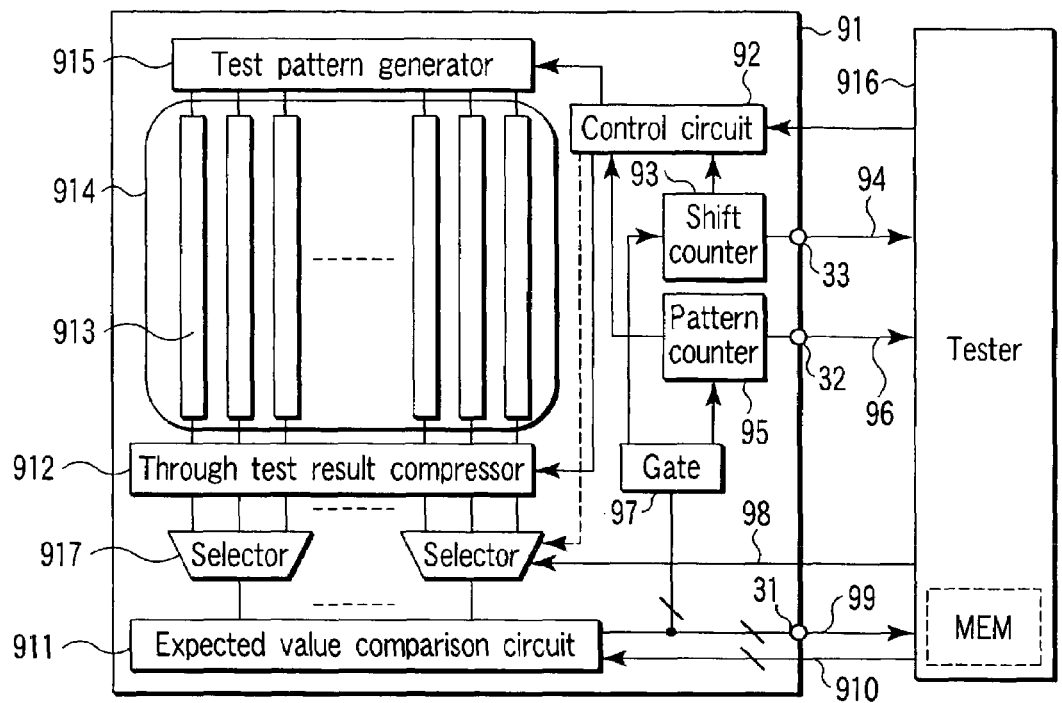
F I G. 9
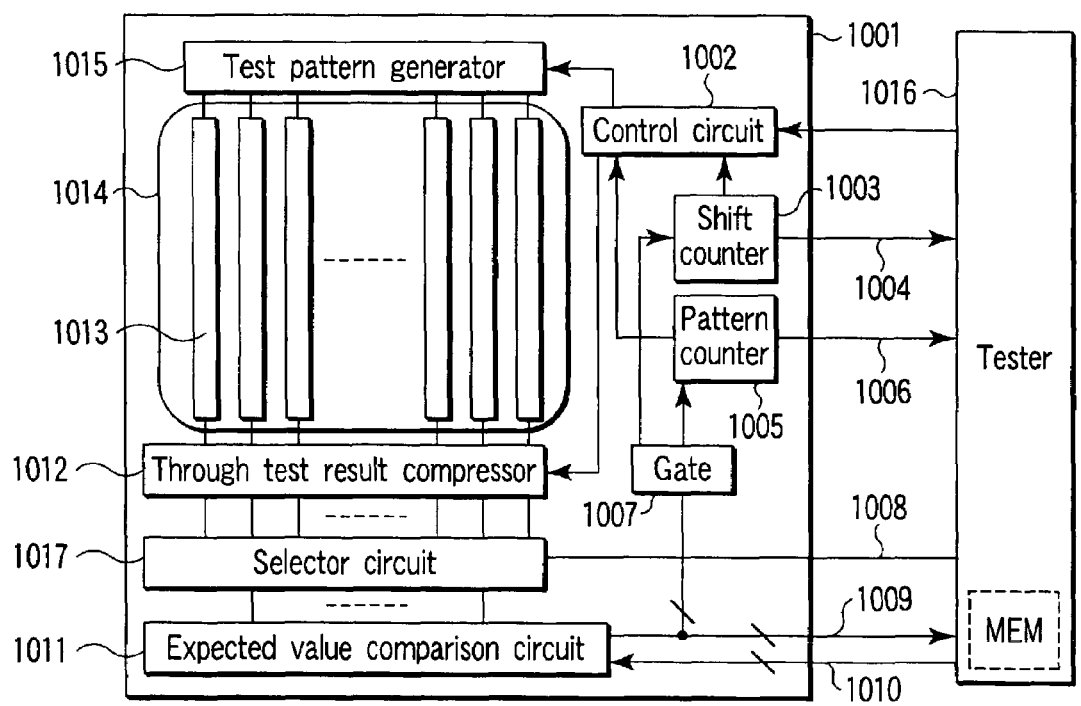
F I G. 10

SEMICONDUCTOR INTEGRATED CIRCUIT, DESIGN SUPPORT APPARATUS, AND TEST METHOD

CROSS-REFERENCE TO RELATED APPLICATIONS

This application is based upon and claims the benefit of priority from the prior Japanese Patent Application No. 2002-133186, filed May 8, 2002, the entire contents of which are incorporated herein by reference.

BACKGROUND OF THE INVENTION

1. Field of the Invention

The present invention relates to a semiconductor integrated circuit (LSI), design support apparatus, and test method, particularly to a logic built-in self-test (BIST) circuit, design support apparatus, and test method, and is applied to, for example, a logic system LSI.

2. Description of the Related Art

As one of the test facilitating methods for solving the difficulty of testing a large and complicated LSI, a logic BIST is used. In the logic BIST, the generation of the test pattern given to a block to be tested, and analysis of the test result output from the block to be tested, are all automatically performed in the LSI by a logic circuit constituted in the periphery of the block to be tested.

FIG. 16 shows a connection relationships between an LSI in which is incorporated a general logic BIST circuit by a self-test using a multiple and parallel shift register sequence generator (STUMPS) system, and an external tester.

An LSI 11 includes a BIST control circuit 12, pattern counter 13, shift counter 14, logic circuit 18 including a large number of flip-flop circuits, test pattern generator 19, test result compressor 16, and the like.

The logic circuit 18 includes a plurality of scan chains 17 chain-connected to flip-flops, and is the block to be tested by the logic BIST. The control circuit 12 receives an external input signal 111 for setting a test mode from a tester 15 to set the LSI 11 to the test mode. The control circuit 12 uses output signals of the pattern counter 13 or shift counter 14 to control the block to be tested 18, test pattern generator 19, and test result compressor 16, and performs BIST control.

In the test mode, first after the logic BIST circuit is initialized, the logic BIST is executed. In this case, a test mode signal or BIST clock is supplied from the external input signal 111 via the control circuit 12, or may be directly supplied from the external input signal 111.

During execution of the logic BIST, a test pattern supplied to a scan chain 17 is automatically generated by the test pattern generator 19. Moreover, a test result output from the scan chain 17 is supplied to the test result compressor 16. In this test result compressor 16, the test result is compressed into data (signature) having a specific bit length. This test result compressor 16 supplies a signal 110 indicating a test analysis result of the logic circuit 18 to the LSI external tester 15. The tester 15 judges from the signal indicating the supplied test analysis result whether the logic circuit 18 is functioning correctly or not.

In a test in which the logic BIST circuit is used, the test pattern does not have to be prepared in a memory (not shown) of the tester 15. Therefore, the cost of the tester 15 can be reduced. Moreover, all the operations are performed in the LSI 11 in synchronization with a BIST clock signal. Therefore, when a BIST clock signal having a rate higher than the test operation frequency of the tester 15 is used, a test having a rate higher than that of the test by the tester 15 is possible. Accordingly, a product test in an actual operation can be performed.

Moreover, the test in which the logic BIST circuit is used requires only a small number of external input/output signals. Therefore, it is possible to test a plurality of blocks in parallel, and test time can greatly be reduced.

Furthermore, the test using the logic BIST circuit is not restricted by the number of scan inputs/outputs in accordance with the capability of the tester 15. Therefore, a larger number of scan chains 17 can be constructed as compared with a general scan design. When the number of the scan chains 17 is increased, the scan chain length per scan chain becomes shorter, and the test time can be reduced.

In the logic BIST circuit, in general, a logic circuit which is a test object operates at random. A random-number pattern generator is used as the test pattern generator 19. As this random-number pattern generator 19, a linear feedback shift register (LFSR) is frequently used.

FIG. 17 shows a constitution of an LFSR of five bits as one example of the test pattern generator 19 in FIG. 16.

This LFSR is constituted so that results obtained by calculating outputs 1502, 1505 of a specific register (feedback point) and output 1508 of a final-stage register with an exclusive OR gate 1501 are inputs of a top register 1515, and perform a shift operation in synchronization with the clock signal of a clock signal line 1514.

To use this LFSR as the pattern generator, an initialization operation is necessary, and all bits are set to appropriate initial values. In this initialization operation, the bit is set to the initial value held inside LSI in some case, and set to the initial value from the outside in the other case.

In the initialized LFSR, the values of registers 1515, 1503, 1504, 1506, 1507 are calculated and shifted by the exclusive OR gate 1501 in response to the clock signal. As a result, the values of the registers 1515, 1503, 1504, 1506, 1507 change at random. The random values of the registers are supplied as the random pattern to the block to be tested via output signal lines 1509, 1510, 1511, 1512, 1513.

The result of the test using the above-described test pattern is analyzed by the test result compressor 16 in FIG. 16. This test result compressor 16 is constituted, for example, of a multiple input signature register (MISR). The basic structure of this MISR is the same as that of the LFSR, but different in that the input data is taken in parallel.

FIG. 18 shows the constitution of a five-bit MISR as one example of the test result compressor 16 in FIG. 16.

In this MISR, exclusive OR gates 1610, 1609, 1608, 1607, 1606 are disposed for registers 1611, 1612, 1613, 1614, 1615 of stages. These exclusive OR gates 1610, 1609, 1608, 1607, 1606 calculate output signals of a previous-stage register (additionally, the output signal of the last-stage register 1615 for the exclusive OR gate 1610) and parallel input signals 1601, 1602, 1603, 1604, 1605. This calculation result is supplied and shifted to the respective registers 1611, 1612, 1613, 1614, 1615 in synchronization with the clock signal of a clock signal line 1616. The register 1613 receives a result obtained by calculating the parallel inputs and output signals of the previous-stage register and final-stage register 1615.

Also when this MISR is used as the test result compressor, the initialization is necessary in the same manner as in the LFSR. However, unlike the LFSR, it is also possible to initialize all the bits to "0".

When the clock signal is supplied to the initialized MISR, the parallel input data 1601, 1602, 1603, 1604, 1605 are taken in and compressed. Finally, data finally left in the register is a compression result. When the compression result is compared with an expected value (hereinafter referred to as the signature) obtained beforehand by calculation, a failure is judged.

As described above, by the test using the logic BIST circuit, presence/absence of a failure in the LSI is judged. As a result, for an LSI having the failure, the failure is sometimes analyzed.

In this case, as described above, since the information indicating the presence/absence of the failure is compressed inside the LSI in the test using the logic BIST circuit, the information necessary for analyzing the failure cannot be obtained as such. The failure analysis requires the information of a test pattern (failure pattern) for detecting the failure and scan flip-flop (failure scan flip-flop) for taking in the influence of the failure. Therefore, it is necessary to obtain this information with an operation different from a usual logic BIST operation.

When the logic BIST circuit is used to analyze the failure, there is a method of dividing the operation for each pattern. Here, one pattern indicates that a logic value captured in parallel by the scan flip-flop is serially shifted out. In general, serial shift out of a n-th pattern and serial shift in of n+1st pattern are simultaneously performed. Therefore, here, a segment of one pattern is set from when the values are captured in parallel until the logic values are serially shifted out.

In this case, the states of a test result analyzer are compared with one another for each pattern, and a pattern in which the expected value differs from the signature is identified. Therefore, the test pattern for detecting the failure is obtained.

Next, to know the position of the failure scan flip-flop, the scan chain 17 of the block to be tested 18 shown in FIG. 16 is switched to a scan test mode.

FIG. 19 shows a constitution example of the scan test mode of the logic BIST circuit shown in FIG. 16.

An LSI to be tested 1701 is switched to the scan test mode by a control signal 1703 from a tester 1710, and a scan chain 1706 is cut off from a test pattern generator 1709 and test result compressor 1705. This scan chain 1706 is connected to one or several scan chains.

A scan input terminal 1708 and scan output terminal 1704 are connected to a scan channel of the tester 1710. In this scan test mode, the test pattern obtained beforehand is scanned in or out from the outside to specify a failure scan flip-flop.

However, when the logic BIST circuit is used to analyze the failure as described above, there are several problems as follows.

That is, an execution result of the tester has to be analyzed in order to obtain the test pattern. In addition to this analysis time, a test time lengthens, because the mode is switched to the scan test mode as shown in FIG. 19 to carry out the test a plurality of times.

Moreover, it is necessary to separately prepare the scan test pattern, and as a problem, a design time required until the scan becomes possible lengthens.

Furthermore, the mode is switched to the scan test mode to carry out the test. Therefore, the failure which can be detected only by a logic BIST operation cannot be analyzed. This is an important problem, when an actual operation rate test is carried out by the logic BIST operation. Therefore, there has been a semiconductor integrated circuit in which during the test performed using the logic BIST circuit, it is possible to output number information of the pattern in which the failure is detected, and further the position information of the scan flip-flop as circumstances demand, and a failure analysis operation can easily be performed outside. Furthermore, to design the logic BIST circuit, there has been a demand for development of a design support apparatus of a semiconductor integrated circuit, which can easily prepare a file. The file includes a correspondence between failure count and failure pattern, in which conversion of the failure count to the failure pattern is possible.

BRIEF SUMMARY OF THE INVENTION

According to an aspect of the invention, there is provided a semiconductor integrated circuit comprising: a test circuit which is incorporated in a logic circuit to test the logic circuit and which comprises a test pattern generator to generate a test pattern supplied to the logic circuit and a compressor to compress a test result output from the logic circuit; a pattern counter which counts the test pattern at a test time of the logic circuit; and a failure information output circuit which is connected to the test circuit and which outputs step information of the test pattern corresponding to a failure to the outside of the semiconductor integrated circuit when the failure is detected at the time of the logic circuit and which outputs a count signal at the detection time of the failure to the outside of the semiconductor integrated circuit from the pattern counter.

According to another aspect of the invention, there is provided a semiconductor integrated circuit comprising: a test circuit which is incorporated in a logic circuit to test the logic circuit and which comprises a test pattern generator to generate a test pattern supplied to the logic circuit and a compressor to compress a test result output from the logic circuit and in which the logic circuit comprises a plurality of scan chains including a plurality of serial connected registers and the compressor comprises a through output portion to directly output the test result output from the logic circuit; a pattern counter which counts the test pattern at a test time of the logic circuit; a shift counter which counts the number of shifts in the scan chain in the logic circuit at the test time of the logic circuit; and a failure information output circuit which is connected to the test circuit and which outputs step information of the test pattern corresponding to a failure to an integrated circuit external terminal, when the failure is detected at a test time of the logic circuit and which outputs count signals of the pattern and shift counters at the detection time of the failure to the outside of the semiconductor integrated circuit.

According to another aspect of the invention, there is provided a design support apparatus of a semiconductor integrated circuit, comprising: a first generation section to which circuit data and first control file are supplied and which generates necessary data of a logic BIST circuit from the circuit data and first control file; and a second generation section to which the circuit data, data of the logic BIST circuit generated by the first generation section, and second control file are supplied and which generates circuit data obtained by inserting the data of the logic BIST circuit in the circuit data after inserting the logic BIST circuit, test pattern for performing a logic BIST operation, and related information of the logic BIST circuit or test pattern.

According to another aspect of the invention, there is provided a method of self-testing a logic circuit mounted in a semiconductor integrated circuit, comprising: supplying a test pattern to the logic circuit; comparing data output from the logic circuit with an expected value corresponding to the test pattern to output step information of the test pattern corresponding to a failure as a failure log to a tester outside the semiconductor integrated circuit, when the data disagrees with the expected value as a result of the comparison; and detecting the failure based on the failure log in the tester.

According to another aspect of the invention, there is provided a method of self-testing a logic circuit mounted on a semiconductor integrated circuit, comprising: supplying a test pattern to the logic circuit to count the number of test patterns, the logic circuit comprising a scan chain in which a plurality of registers are connected in series; shifting the test pattern to the plurality of registers of the scan chain to count the number of shifts; comparing data output from the logic circuit for each shift with the expected value corresponding to the test pattern; outputting the number of test patterns at a mismatch time and the number of shifts as a failure log to a tester outside the semiconductor integrated circuit, when the data disagrees with the expected value as a result of comparison; and detecting a failure based on the failure log by the tester.

According to another aspect of the invention, there is provided a method of self-testing a logic circuit mounted on a semiconductor integrated circuit, comprising: supplying a test pattern to the logic circuit to count the number of test patterns, the logic circuit comprising a scan chain in which a plurality of registers are connected in series; comparing compressed data output from the logic circuit with the expected value corresponding to the test pattern; outputting the number of test patterns at a mismatch time as a first failure log to a tester outside the semiconductor integrated circuit, when the data disagrees with the expected value as a result of comparison; obtaining a failure pattern and expected value in accordance with the first failure log; supplying the failure pattern as the test pattern to the logic circuit to count the number of test patterns; shifting the test pattern to the plurality of registers of the scan chain to count the number of shifts; comparing data output from the logic circuit with the expected value corresponding to the test pattern for each shift; outputting a failure flag and the number of shifts as a second failure log to the tester outside the semiconductor integrated circuit, when the data disagrees with the expected value as a result of the comparison; and detecting a failure based on the second failure log by the tester.

According to another aspect of the invention, there is provided a method of self-testing a logic circuit mounted on a semiconductor integrated circuit, comprising: supplying a test pattern to the logic circuit to count the number of test patterns, the logic circuit comprising a scan chain in which a plurality of registers are connected in series; shifting the test pattern to the plurality of registers of the scan chain to count the number of shifts; comparing data output from the logic circuit with the expected value corresponding to the test pattern, the data output from the logic circuit being passed through XOR; outputting a failure flag, the number of test patterns at a mismatch time, and the number of shifts as a first failure log to a tester outside the semiconductor integrated circuit, when the data disagrees with the expected value as a result of comparison; obtaining a failure pattern, expected value, and XOR to which the failure scan chain belongs in accordance with the first failure log; supplying the failure pattern as the test pattern to the logic circuit to count the number of test patterns; shifting the test pattern to the plurality of registers of the scan chain to count the number of shifts; comparing data output from the logic circuit with the expected value corresponding to the test pattern for each shift, the data output from the logic circuit being passed through the XOR to which the failure scan chain belongs; outputting the failure flag and the number of shifts as a second failure log to the tester outside the semiconductor integrated circuit, when the data disagrees with the expected value as a result of the comparison; and detecting a failure based on the second failure log by the tester.

BRIEF DESCRIPTION OF THE SEVERAL VIEWS OF THE DRAWING

FIG. 9 is a block diagram showing the connection relationship between the LSI on which the logic BIST circuit of a selector type is mounted according to a third embodiment of the present invention, and the external tester;

FIG. 10 is a circuit diagram showing one example of a narrow-down circuit in which functions of N selectors in the logic BIST circuit shown in FIG. 9 are realized;

DETAILED DESCRIPTION OF THE INVENTION

Embodiments of the present invention will be described hereinafter in detail with reference to the drawings.

FIRST EMBODIMENT

Figure 1:
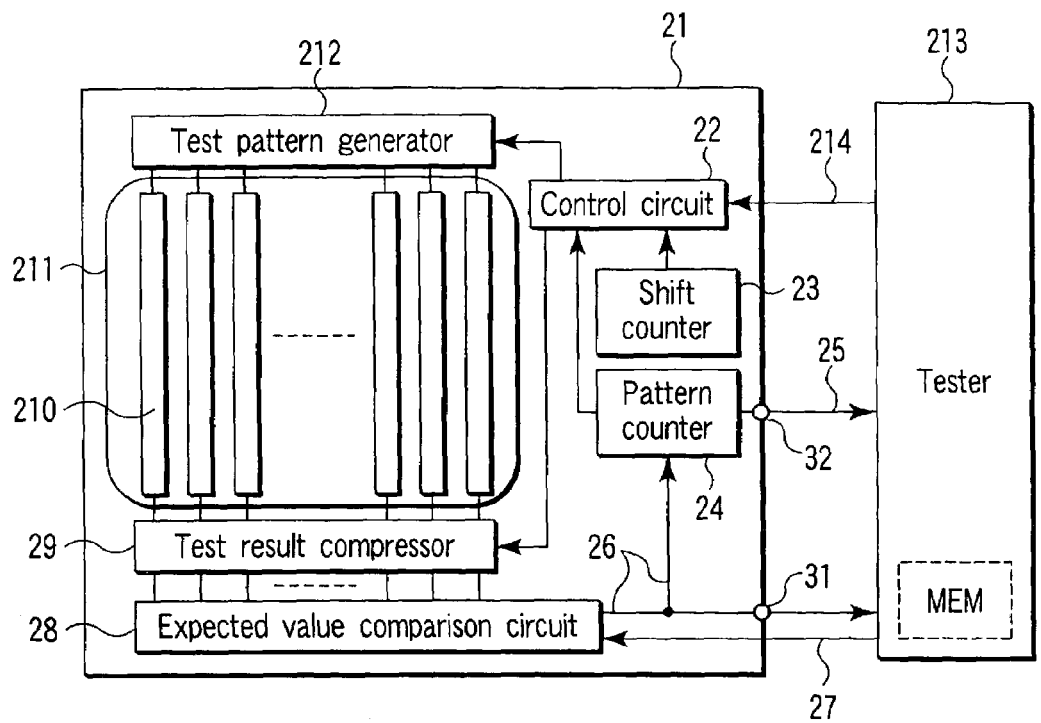
FIG. 1 is a block diagram showing a connection relationship between an LSI on which a logic BIST circuit is mounted according to a first embodiment of the present invention, and an external tester.

FIG. 1 is a block diagram showing a connection relationship between an LSI on which a logic BIST circuit is mounted according to a first embodiment of the present invention, and an external tester.

Figure 16:
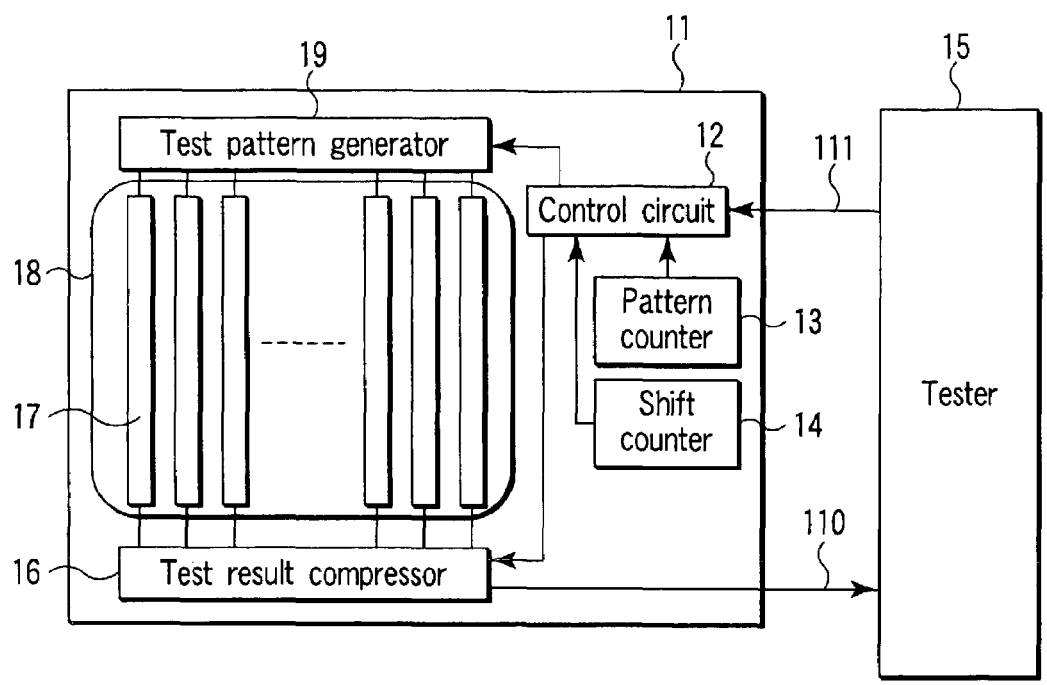
FIG. 16 is an explanatory view of a general constitution of the logic BIST circuit by a STUMPS system.

An LSI 21 is different from an LSI in which a usual logic BIST circuit shown in FIG. 16 is built in that a failure information output circuit is disposed to output from the LSI step information of a test pattern, when a failure is detected by logic BIST. Since the other respects are subsequently the same, the same parts of FIG. 1 as those of FIG. 16 are denoted with the same names.

In FIG. 1, the failure information output circuit is constituted, for example, of an expected value comparison circuit 28, first external terminal 31, and second external terminal 32. The expected value comparison circuit 28 compares a compressed value output from a test result compressor 29 with an expected value input from the tester outside the LSI for each test pattern, and outputs a failure flag 26 at a mismatch detection time. The first external terminal 31 outputs from the LSI the failure flag 26. The second external terminal 32 outputs from the LSI a pattern count output signal 25 at a time when a pattern counter 24 receives the failure flag 26.

In FIG. 1, an LSI 21 including a block to be tested 211 includes a control circuit 22, shift counter 23, pattern counter 24, logic circuit 211 including a large number of flip-flops, test pattern generator 212, and test result compressor 29.

The logic circuit 211 includes a plurality of scan chains 210 in which flip-flops are chain-connected to constitute the block to be tested of the logic BIST. The control circuit 22 receives an external input signal 214 for setting the test mode from a tester 213 to set the LSI 21 into the test mode. Furthermore, the control circuit 22 uses the output of the pattern counter 24 or shift counter 23 to control the block to be tested 211, test pattern generator 212, and test result compressor 29, and performs the BIST control.

Figure 17:
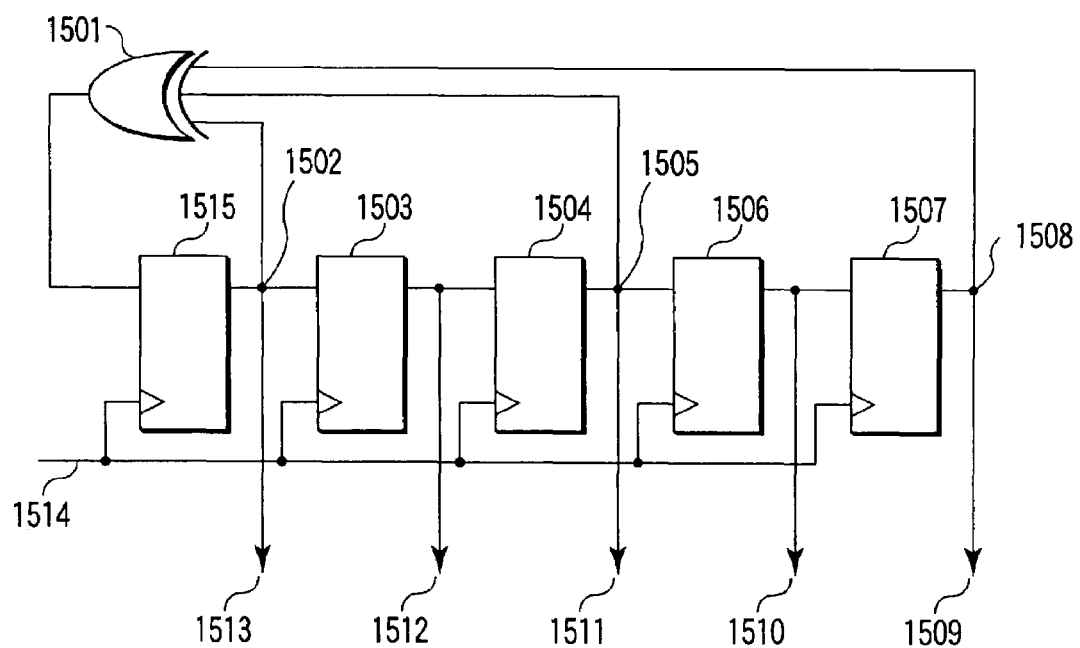
FIG. 17 is a circuit diagram showing a constitution example of an LFSR of five bits as one example of a test pattern generator shown in FIG. 16.
Figure 18:
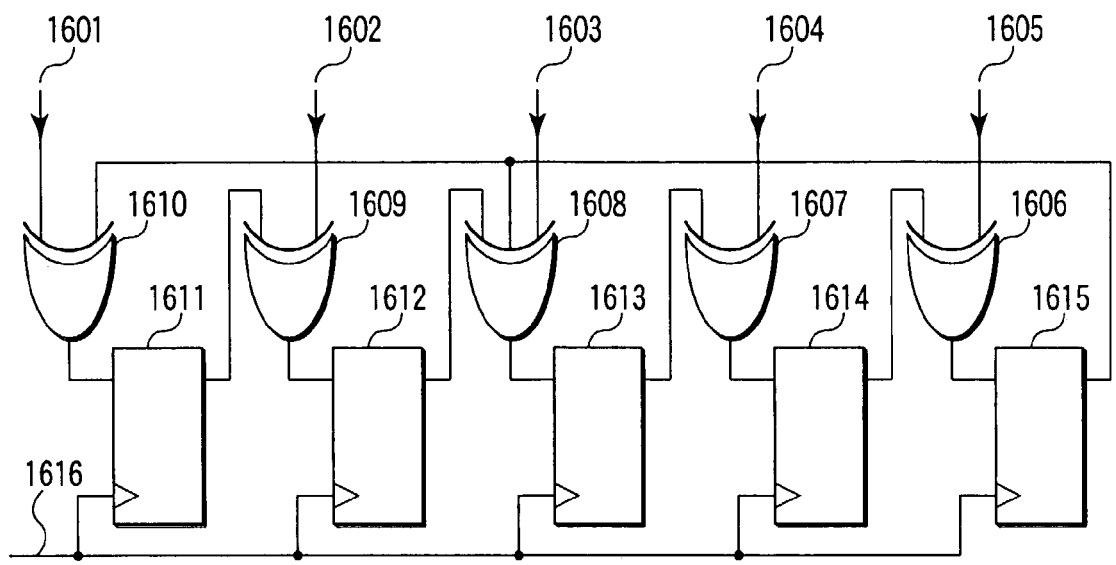
FIG. 18 is a circuit diagram showing the constitution example of an MISR of five bits as one example of a test result compressor shown in FIG. 16.
Figure 19:
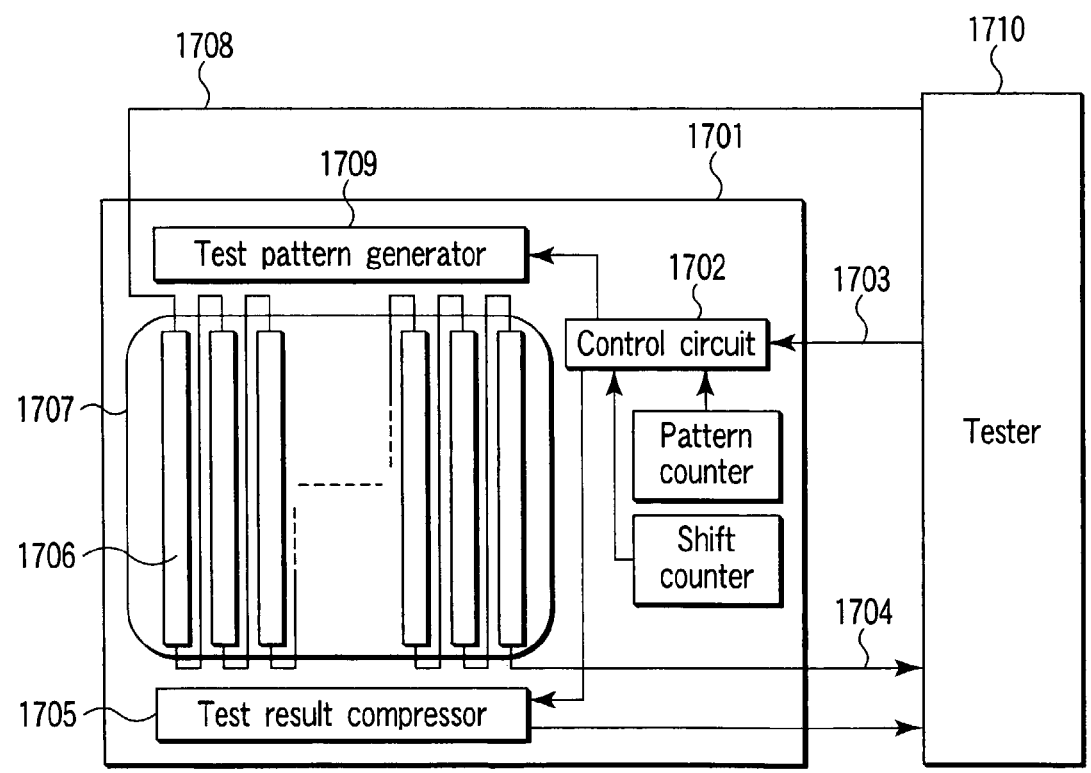
FIG. 19 is a block diagram showing a connection relationship between an LSI on which the logic BIST circuit of the STUMPS system is mounted, and the external tester.

The test pattern generator 212 is constituted, for example, as shown in FIG. 17, and the test result compressor 29 is constituted, for example, as shown in FIG. 18.

The pattern counter 24 is used to count the test pattern in the test in which the logic BIST circuit is used. The shift counter 23 is used to count the number of shifts in the scan chains 210 in the test in which the logic BIST circuit is used.

In the test mode, first after the logic BIST circuit is initialized, the logic BIST is executed. In this case, a test mode signal or BIST clock may be supplied from the external input signal 214 via the control circuit 22, but may be supplied directly from the external input signal 214.

During the execution of the logic BIST, the test pattern generator 212 automatically generates an input signal for the scan chains 210, and supplies the signal to the chain. The test result compressor 29 receives the output signal in accordance with the test result output from the scan chains 210, compresses the signal into the signature having a specific bit length, and outputs the signature.

The LSI 21 shown in FIG. 1 operates in the same manner as the usual logic BIST, even when the failure is analyzed. That is, the LSI 21 is changed to the logic BIST mode by the test control signal 214 input from the tester 213, and the logic BIST circuit is initialized. Thereafter, a self-test is carried out. In this case, the test mode signal or BIST clock signal is directly supplied from the outside, or supplied via the control circuit 22.

When the BIST test starts, the expected value of each test pattern is supplied to the expected value comparison circuit 28 by an expected value input signal 27 from the tester 213. This expected value is data generated, for example, by simulation. That is, for this expected value, the test pattern is supplied to the logic circuit 21 by simulation, and output data of the logic circuit 21 is generated for each test pattern. This expected value is data which has the same bit width as that of the output data of the compressor 29, and is stored beforehand in the tester 213. The expected value comparison circuit 28 compares the compressed value output from the test result compressor 29 with the expected value supplied from the tester 213 for each test pattern. When the comparison ends, the value is initialized regardless of the comparison result.

Figure 2:
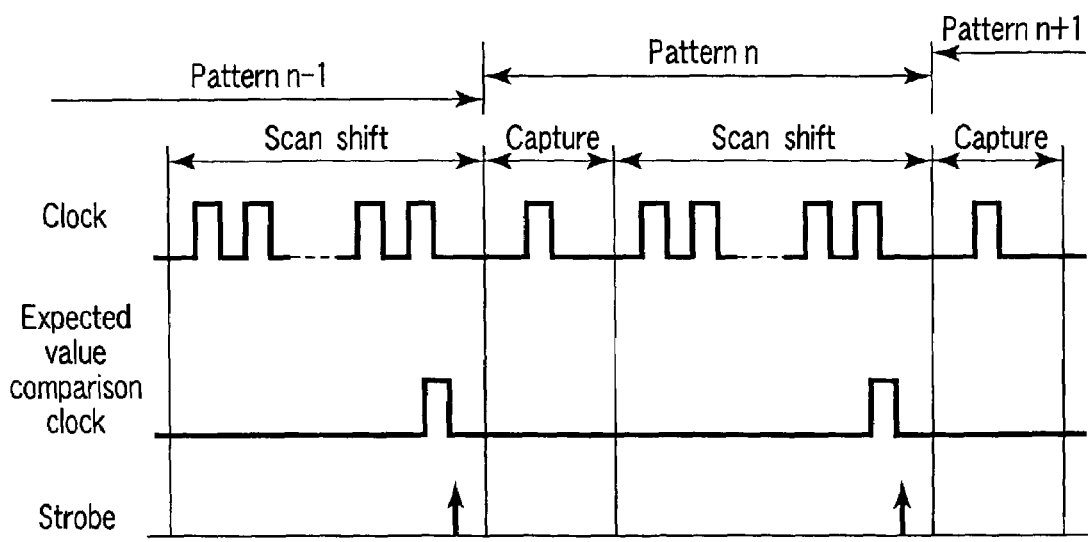
FIG. 2 is a waveform diagram showing a relationship between a clock for BIST operation and an expected value comparison clock at a test time of the LSI shown in FIG. 1, and a strobe of the tester.

FIG. 2 shows a waveform indicating a relationship between a clock for BIST operation and an expected value comparison clock at a test time of the LSI 21 of FIG. 1, and a strobe of the tester 213.

Simultaneously with end of the scan shift of each test pattern, the expected value comparison circuit 28 compares the output value of the compressor 29 with the expected value in synchronization with the expected value comparison clock signal. When the output value of the compressor 29 disagrees with the expected value, the expected value comparison circuit 28 activates the failure flag 26. The failure flag 26 is output via the first external terminal 31. On receiving the failure flag 26, the tester 213 records the time when the failure occurs as the failure log.

Moreover, the failure flag 26 is also input to the pattern counter 24. When the failure flag 26 is activated, the pattern counter 24 outputs the pattern count value as the pattern count signal 25 from the second external terminal 32. The pattern count value is the value of the register of the pattern counter.

The tester 213 can record a pattern count (failure count) which indicates the failure pattern by the failure flag signal 26 and pattern count signal 25.

Figure 3:
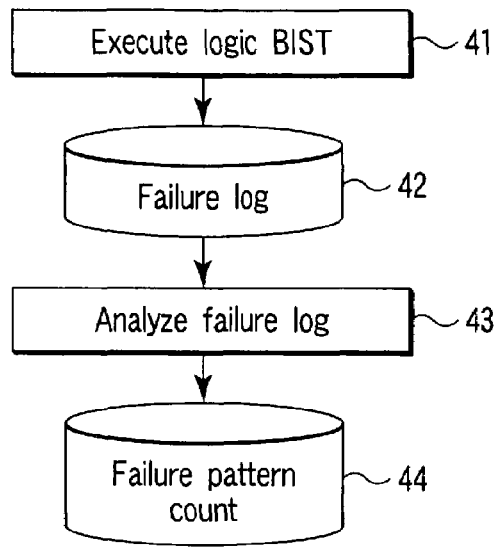
FIG. 3 is a flowchart schematically showing an execution flow in performing a logic BIST and failure analysis of the LSI shown in FIG. 1.

FIG. 3 is a flowchart schematically showing an execution flow in performing the logic BIST and failure analysis of the LSI 21 shown in FIG. 1.

First, the usual logic BIST is executed (step 41). As a result, the failure log (step 42) is stored in the tester 213. As described above, the failure count and failure flag are recorded in this failure log. Therefore, the analysis of the failure log (step 43) may only require processing of extracting the failure count from the log. The failure count and failure pattern are uniquely determined, and the information is obtained at a design time. Therefore, the failure count can easily be converted to the failure pattern.

As described above, according to the LSI on which the logic BIST circuit according to the first embodiment is mounted, the BIST operation is performed once, and pattern count information (number of the pattern in which the failure is detected) of the failure pattern can directly be recorded in the failure log of the tester 213. Therefore, as in the related art, in order to obtain the information of the failure pattern, it is unnecessary to execute the BIST operation a plurality of times after the mode is changed. Therefore, the test time by the tester 213 can be reduced, and the test cost can be reduced.

Figure 4:
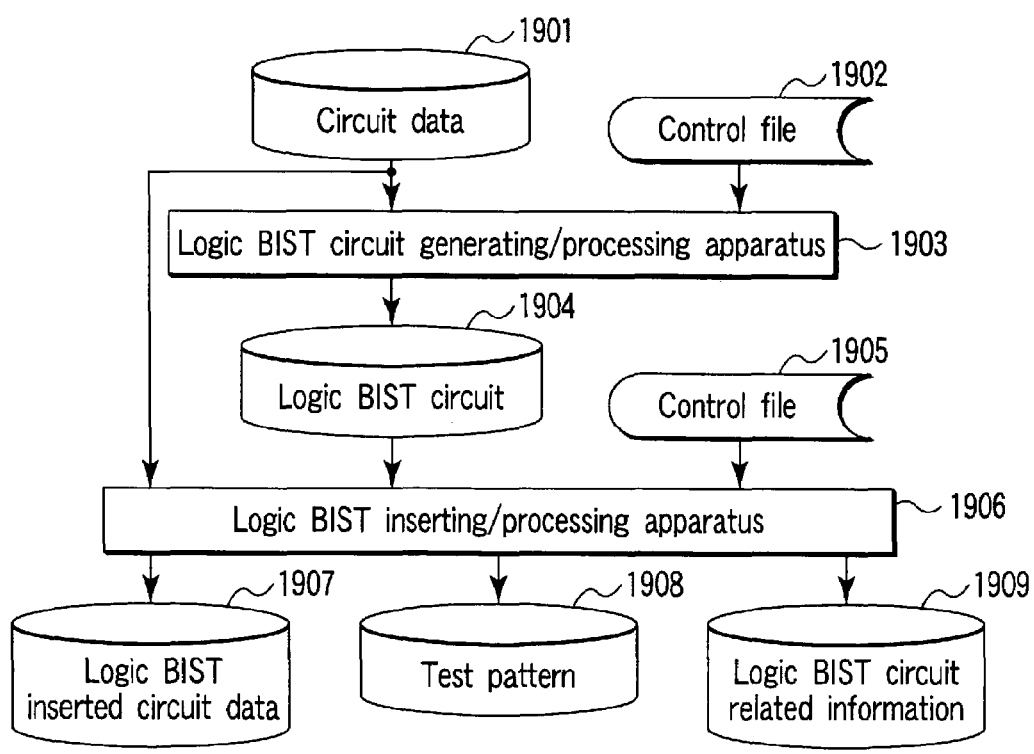
FIG. 4 is a diagram showing one example of a design support apparatus to constitute the logic BIST circuit shown in FIG. 1.

FIG. 4 shows one example of a design support apparatus for constituting the logic BIST circuit shown in FIG. 1.

First, circuit data 1901 and a control file 1902 are input into a logic BIST generating/processing apparatus 1903, and necessary data 1904 of the logic BIST circuit is generated. Next, the circuit data 1901, generated data 1904 of the logic BIST circuit, and control file 1905 are input into a logic BIST inserting/processing apparatus 1906. The logic BIST inserting/processing apparatus 1906 generates logic BIST circuit inserted circuit data 1907 in which the data 1904 of the logic BIST circuit is inserted in the circuit data 1901, a test pattern 1908 for performing the logic BIST operation, and related information (file) 1909 of the logic BIST circuit or test pattern.

The file 1909 includes correspondence between the failure count and failure pattern. Therefore, the failure count can be converted to the failure pattern only by referring to the file 1909.

SECOND EMBODIMENT

Figure 5:
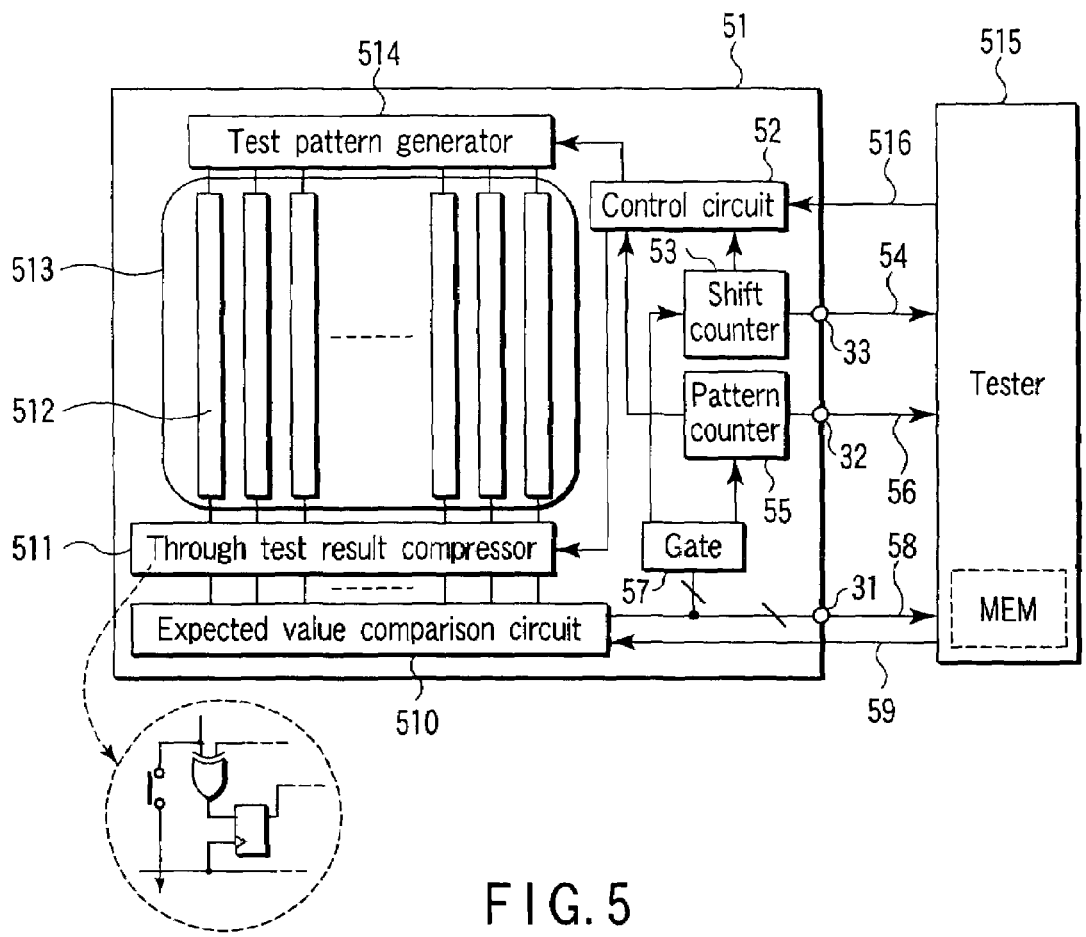
FIG. 5 is a block diagram showing the connection relationship between the LSI on which the logic BIST circuit is mounted according to a second embodiment of the present invention, and the external tester.

FIG. 5 shows the connection relationship between the LSI on which the logic BIST circuit is mounted according to a second embodiment of the present invention, and the external tester.

This LSI 51 is different from the logic BIST circuit of the first embodiment shown in FIG. 1 in a test result compressor 511 which has a through function and failure information output circuit. The other constitution is subsequently similar to that of the first embodiment.

The test result compressor 511 having the through function includes a function of compressing data as the test result, and through function. In the through function, the signal supplied to the compressor 511 is directly output without being compressed.

Moreover, the failure information output circuit has a function of outputting step information of the test pattern and information of the register in a logic circuit 513 in which the failure is propagated to the outside of the LSI, when the failure is detected by the logic BIST.

As the failure information output circuit, the present embodiment includes an expected value comparison circuit 510, first external terminal 31, second external terminal 32, third external terminal 33, and gate 57. The expected value comparison circuit 510 compares a through output or compressed value output from the test result compressor 511 having the through function for each test pattern with the expected value input from the tester outside the LSI, and outputs a failure flag 58, when the values disagree with each other. The first external terminal 31 outputs the failure flag 58 to the outside of the LSI. The second external terminal 32 outputs a pattern count output signal 56 at a time when a pattern counter 55 receives the failure flag 58 to the outside of the LSI. The third external terminal 33 outputs a shift count output signal 54 at a time when a shift counter 53 receives the failure flag 58 to the outside of the LSI. The gate 57 also serves as the failure flag 58.

In the test mode, first after the logic BIST circuit is initialized, the logic BIST is executed. In this case, the test mode signal or BIST clock signal may also be supplied from an external input signal 516 via a control circuit 52, or may be supplied directly from the external input signal 516.

During the execution of the logic BIST, a test pattern generator 514 automatically generates the input signal for scan chains 512. The test result compressor 511 having the through function receives the test result output from the scan chain 512, and compresses the signal into the signature which has the specific bit length.

The LSI 51 shown in FIG. 5 operates in the same manner as the usual logic BIST, even when the failure is analyzed. That is, the LSI 51 is changed to the logic BIST mode by the test control signal 516 supplied from a tester 515. When the BIST test starts, an expected value input signal 59 supplied from the tester 515 is supplied as the expected value for each bit shift of the scan shift to the expected value comparison circuit 510. The expected value comparison circuit 510 compares the output signal passed through the test result compressor 511 with the expected value supplied from the tester 515 for each bit shift.

Figure 6:
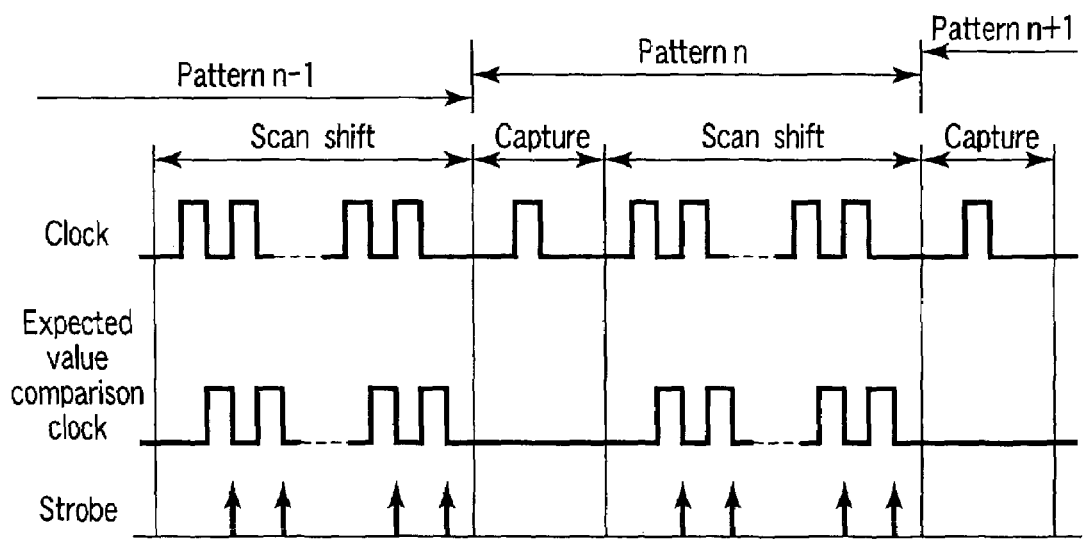
FIG. 6 is a waveform diagram showing the relationship between the clock for BIST operation and expected value comparison clock at the test time of the LSI shown in FIG. 5, and the strobe of the tester.

FIG. 6 shows a waveform indicating the relationship between the clock for BIST operation and expected value comparison clock at the test time of the LSI 51 shown in FIG. 5, and the strobe signal of the tester 515.

The expected value comparison clock signal is supplied for each bit shift of the scan shift, and the expected values are compared with each other in synchronization with the clock signal. When the comparison result of the expected value is mismatch, the expected value comparison circuit 510 outputs the failure flag 58, and this failure flag 58 is supplied to the tester 515 via the first external terminal 31. This failure flag 58 has the bit width of the expected value, and the tester 515 records a bit string of the failure flag 58 as the failure log. Therefore, when the failure log is analyzed, the scan chain including the failure scan flip-flop can be specified in accordance with the bit string.

The failure flag 58 is supplied to the pattern counter 55 and shift counter 53 via the gate 57. The gate 57 reduces the bit width of the failure flag 58 to be not more than the bit width of the expected value. For the reason why the bit width of the failure flag 58 is reduced, the pattern counter 55 and shift counter 53 do not require information indicating the scan chain in which the failure exists, and the number of wirings in the circuit is reduced.

On receiving the failure flag 58, the pattern counter 55 outputs the count value (pattern counter) as the pattern count signal 56. This pattern count signal 56 is supplied to the tester 515 via the second external terminal 32.

On receiving the failure flag 58, the shift counter 53 also outputs the count value (shift count) as the shift count signal 54. This shift count signal 54 is supplied to the tester 515 via the third external terminal 33.

The tester 515 sets all the initial values of the pattern count and shift count to "0", and thereby records a pattern count value (failure pattern count) and shift count value (failure shift count) at generation time of the failure into the failure log.

Figures 7, 8:
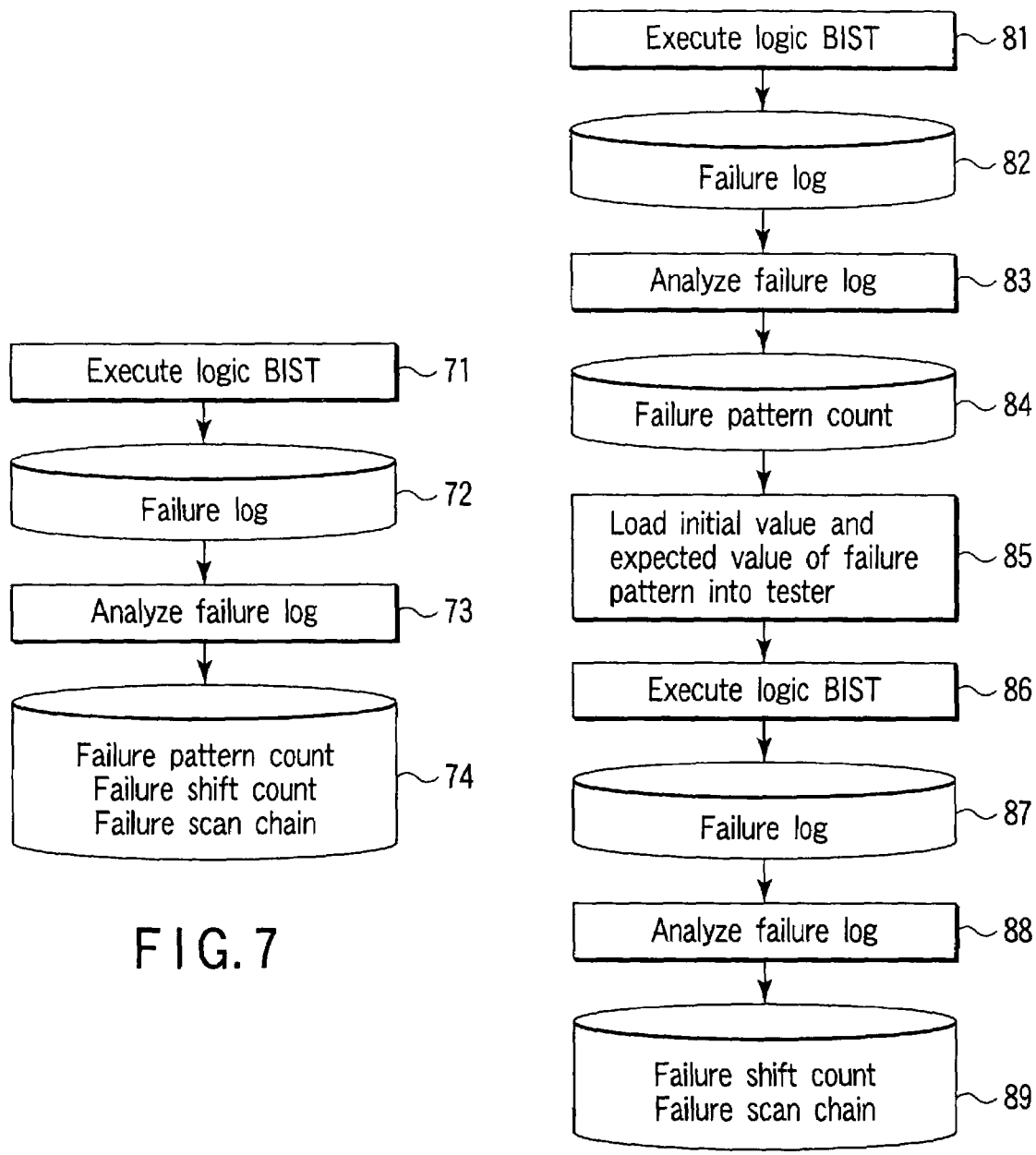
FIG. 7 is a flowchart schematically showing the execution flow in performing the logic BIST and failure analysis of the LSI shown in FIG. 5.
FIG. 8 is a flowchart schematically showing the execution flow of another example for performing the logic BIST and failure analysis of the LSI shown in FIG. 5.

FIG. 7 is a flowchart schematically showing an operation for performing the logic BIST and failure analysis of the LSI shown in FIG. 5.

First, the usual logic BIST is executed (step 71). Then, the test result is supplied to the tester 515, and recorded as the failure log (step 72). As described above, the failure log includes the bit string, failure pattern count, and failure shift count of the failure flag 58.

In the analysis of the failure log (step 73), information 74 of the bit string, failure pattern count, and failure shift count is extracted from the failure log recorded in step 72. The bit string of the failure flag signal uniquely shows the failure scan chain, and the failure pattern count indicates the failure pattern.

Since the failure scan chain is specified, and the failure shift count is found, the failure scan flip-flop can be specified. The information of the correspondence is found at the design time. Even when the information is newly prepared, the operation is easily performed.

FIG. 8 is a flowchart schematically showing the operation of another example for performing the logic BIST and failure analysis of the LSI shown in FIG. 5.

In this flow, the BIST operation is executed twice. In a first BIST operation (step 81), the expected value comparison circuit 510 receives the compressed value output signal of the test result compressor 511. The expected value of each pattern is supplied as the expected value signal 59 from the tester 515. The test waveform at this time is shown in FIG. 2.

The expected value comparison circuit 510 compares the compressed value output signal with the expected value for each pattern, and the tester 515 records only the failure pattern count as the failure log (step 82). The analysis of the failure log (step 83) comprises: extracting failure pattern information from the failure log recorded in step 72 to obtain the failure pattern count (step 84). Only the initial value and expected value of the failure pattern indicated by the failure pattern count are loaded onto the memory (MEM) of the tester (step 85).

In a second logic BIST operation (step 86), the expected value comparison circuit 510 receives the output signal passed through the test result compressor 511. In the processing of the step 85, the initial value of the failure pattern loaded in the memory (MEM) of the tester is supplied to the test pattern generator 514 from the tester 515, and the BIST test starts. The test waveform at this time is shown in FIG. 6.

The expected value is supplied to the expected value comparison circuit 510 from the tester 515 for each bit shift of the scan shift by the expected value signal 59. The expected values are compared with each other for each bit shift. As a result, with the mismatch, the failure flag 58 and shift count signal 54 are recorded as the failure log in the tester 515.

When a second logic BIST operation (step 86) ends only with respect to the failure pattern, the failure flag bit string and failure shift count corresponding to the failure pattern are recorded in the tester 515, and the information is output as a failure log 87 (step 87).

The analysis of the failure log (step 88) comprises: extracting two pieces of information 89 of the bit string of the failure flag and the failure shift count corresponding to the failure pattern from the failure log recorded in step 87. The bit string of the failure flag uniquely indicates the failure scan chain, and the failure pattern count indicates the failure pattern.

Since the failure scan chain is specified, and the failure shift count is found, the failure scan flip-flop can be specified. The information of the correspondence is found at the design time. Even when the information is newly prepared, the operation is easily performed.

As described above, according to the logic BIST circuit according to the second embodiment, only when the BIST operation is performed once, not only the pattern count of the failure pattern but also the shift count and the bit of the failure flag indicating the position of the failure scan flip-flop are directly recorded in the failure log of the tester. Therefore, to obtain the information of the failure pattern, it is not necessary to change the mode and execute the operation a plurality of times as in the related art, and the test time in the tester shortens. Moreover, only the usual logic BIST operation is performed. Therefore, a problem does not occur that the detection of the trouble is not reproduced.

Moreover, when the flow for executing the BIST operation twice is selected as in the execution flow shown in FIG. 8, the memory of the tester can be saved. Thereby, even with the tester including little memory, it is possible to analyze the failure in the logic BIST, and the test cost can be lowered. Even in this case, since the normal logic BIST operation is executed, no problem is generated concerning the reproducibility of the failure. Furthermore, in this case, since it is not necessary to prepare the scan test pattern or to prepare the scan test mode, there is little increase of the design time.

It is to be noted that the design support apparatus for constituting the logic BIST circuit shown in FIG. 5 is similar to that of the first embodiment shown in FIG. 4. In this case, when the output data 1909 concerning the logic BIST output from the design support apparatus shown in FIG. 4 also includes the information of the failure scan flip-flop corresponding to the failure shift and failure scan chain, the failure scan flip-flop can also be specified only by referring to this data.

THIRD EMBODIMENT

When the number (M) of internal scan chains of the block to be tested of the LSI is larger than the number (N) of pins of the tester, the number of internal scan chains needs to be adjusted to the number of pins of the tester in order to compare the expected values with each other every bit shift.

Alternatively, when the scan memory of the tester is used to supply the expected value to the logic BIST circuit, the number of scan paths inside the block to be tested is sometimes larger than the number of scan channels. In this case, the number of scan channels needs to be matched with the number of scan paths.

FIG. 9 shows the connection relationship between the LSI on which the logic BIST circuit of a selector type is mounted according to a third embodiment of the present invention, and the external tester.

This LSI 91 is different from the logic BIST circuit of the second embodiment shown in FIG. 5 in that the LSI 91 includes N selectors 917. These N selectors 917 are connected between a test result compressor 912 having a through function of outputting the input signal as the output signal as such, and expected value comparison circuit 911. Each selector 917 is a selection circuit of M/N:1. Therefore, N selectors 917 are necessary.

When the failure is analyzed with respect to all the scan flip-flops 913, a select signal 98 supplied to each selector 917 from a tester 916 is changed to repeat the BIST operation.

In the failure analysis operation, a pattern counter 95 and shift counter 93 operate in the same manner as in the second embodiment. That is, the pattern counter 95 outputs a failure pattern count signal 96 in accordance with a failure flag 99 output from the expected value comparison circuit 911. Moreover, the shift counter 93 outputs a failure count signal 94 in response to a failure flag 99.

The tester 916 records the failure flag 99, failure count signal 94, and failure pattern count signal 96. The number of operations for analyzing the failure is M/N.

It is to be noted that in the logic BIST circuit shown in FIG. 9, the select signal 98 is supplied to the selector 917 from the tester 916, but may also be supplied from a control circuit 92 as shown by a broken line. Additionally, in this case, the select signal 98 needs to supply the signal to the control circuit 92 from the tester 916 at a mismatch time of the expected value.

MODIFICATION EXAMPLE OF THIRD EMBODIMENT

FIG. 10 shows a modification example of N selectors 917 shown in FIG. 9, and shows the selector circuit which has the function similar to that of N selectors 917.

This selector circuit 1017 is constituted of an exclusive OR logic circuit (XOR gate) and selector, and constituted so that an output changes by a control signal 1018 (including select signals 1103, 1106 described later) supplied from a tester 1016.

Figure 11:
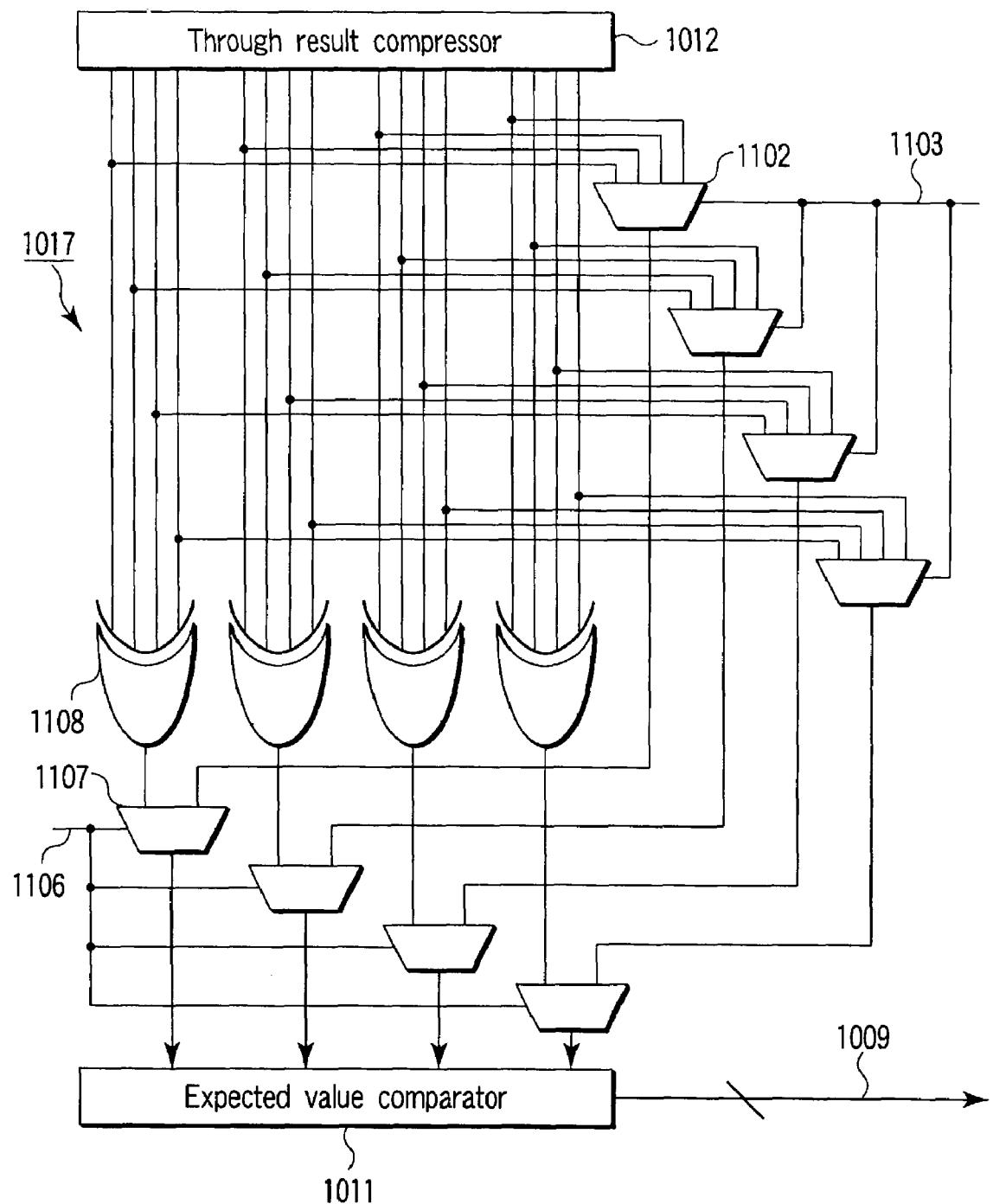
FIG. 11 is a circuit diagram showing a circuit in which through outputs of a test result compressor having a through function in FIG. 10 is reduced to four outputs as one example of a selector circuit shown in FIG. 10.

FIG. 11 shows one example of the selector circuit 1017 shown in FIG. 10. The selector circuit 1017 reduces, for example, 16 output signals (scan chain outputs) passed and output through a test result compressor 1012 shown in FIG. 10 down to four signals.

The through output signals of the test result compressor 1012 are supplied, for example, to four XOR gates 1108 and four selectors 1102. The output signals of the respective XOR gates 1108 and selectors 1102 are supplied, for example, to four selectors 1107. Select signals 1103 output from the tester 1016 are supplied to the respective selectors 1102, and select signals 1106 output from the tester 1016 are supplied to the respective selectors 1107. The selectors 1102, 1107 are controlled by these select signals 1103, 1106. The output signals of the selectors 1107 are supplied to an expected value comparison circuit 1011.

When the selector circuit 1017 constituted as described above is used to analyze the failure, processing of two stages is executed.

Figure 12:
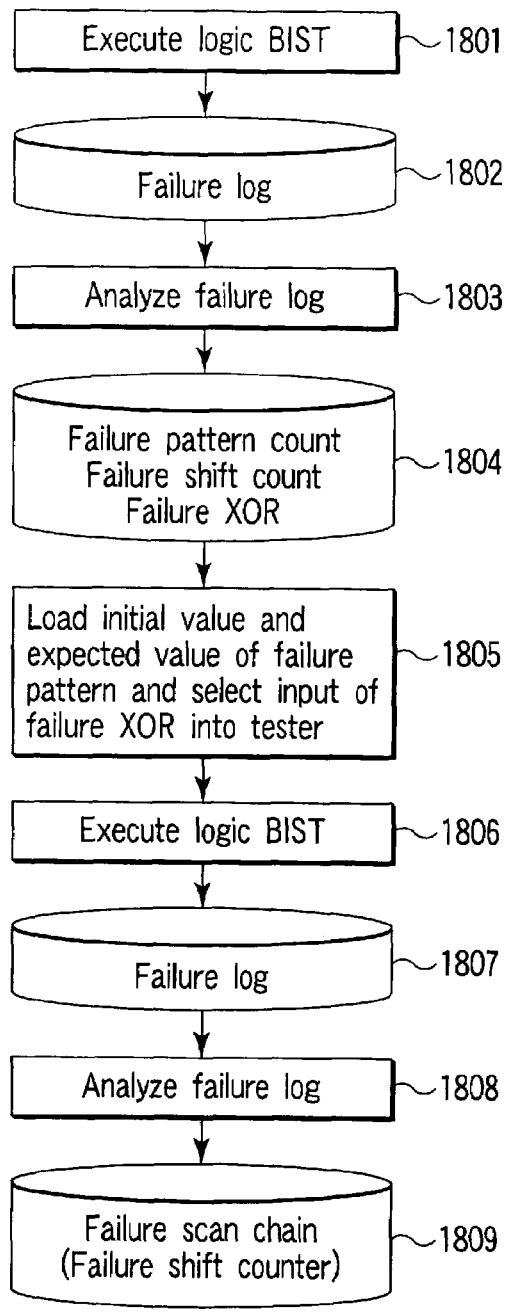
FIG. 12 is a flowchart schematically showing the execution flow in performing the logic BIST and failure analysis of the LSI shown in FIG. 10.

FIG. 12 is a flowchart schematically showing the operation in performing the logic BIST and failure analysis of the LSI shown in FIG. 10.

In this execution flow, the BIST operation is performed twice. In the first BIST operation (step 1801), the selector 1017 selects the output signal of the XOR gate 1108 and supplies the signal to the expected value comparison circuit 1011 in response to the select signal 1106.

The expected value comparison circuit 1011 receives an expected value signal 1010 as the expected value of each pattern from the tester 1016 to compare the expected value with the output signal of the XOR gate 1108 for each pattern. As a result of the comparison, when the value disagrees with the signal, the bit string is output to the tester 1016 by the failure flag 1009. Additionally, a pattern counter 1005 outputs a failure pattern count signal 1006 in response to the failure flag 1009 supplied via a gate 1007. Furthermore, a shift counter 1003 outputs a failure shift count signal 1004 in response to the failure flag 1009 supplied via the gate 1007. The failure shift count signal 1004 and failure pattern count signal 1006 are supplied to the tester 1016. The tester 1016 records the failure flag 1009, failure shift count signal 1004, and failure pattern count signal 1006 as a failure log 1802.

Next, in the analysis of the failure log (step 1803), information 1804 of the failure pattern count signal, failure shift count signal, and XOR (failure XOR) to which a failure scan chain included in the failure flag 1009 belongs is extracted from the failure log 1802. The initial value and expected value of the failure pattern extracted in this manner, and the select data of the failure XOR are loaded in the memory (MEM) of the tester 1016 before executing the second logic BIST 1806 (step 1805). In the second logic BIST operation (step 1806), the selectors 1102, 1107 select the output signal of the scan chain which belongs to the failure XOR and supply the signals to the expected value comparison circuit 1011 in response to the select signals 1103, 1106 supplied from the tester 1016.

In the same manner as in the second embodiment, the expected value comparison circuit 1011 compares the output signal of each selector 1107 with the expected value signal 1010 which is the expected value supplied from the tester 1016 for each bit shift. When this result is mismatch, the expected value comparison circuit 1011 outputs the failure flag 1009. The shift counter 1003 outputs the failure shift count signal 1004 in response to the failure flag 1009 supplied via the gate 1007. The tester 1016 records the bit string of the failure flag 1009 and the failure shift count signal 1004 in a failure log 1807.

As a result of the second logic BIST, the information of the failure scan chain and failure shift count is stored in the failure log 1807. In the analysis of the second failure log (step 1808), information 1809 of the failure scan chain and failure shift count is extracted. Moreover, since the failure shift count is already obtained in the first failure log analysis (step 1803), the recording/analyzing may be omitted.

As described above, according to the logic BIST circuit according to the third embodiment, the selector circuit is used to reduce the number of output signals of the test result compressor 1012. Therefore, even when the number of internal scan chains is larger than the number of pins for scan input/output of the tester 1016, the failure can be analyzed. Therefore, restriction required in the design of the logic BIST can be relaxed.

The design support apparatus described in the first embodiment and shown in FIG. 4 can also be applied to the design of the logic BIST circuit shown in FIG. 9. Moreover, in the same manner as in the second embodiment, the information of the failure scan flip-flop corresponding to the failure shift and failure scan chain is included in output data 1909 concerning the logic BIST output from the design support apparatus of FIG. 4, and thereby the failure scan flip-flop can be specified only by referring to the data.

FOURTH EMBODIMENT

Additionally, when a plurality of XOR gates 1108 are used to simply reduce the number of output signals from the internal scan chain in the same manner as in the third embodiment, there is a possibility that the influence of the failure is canceled out.

Figure 13:
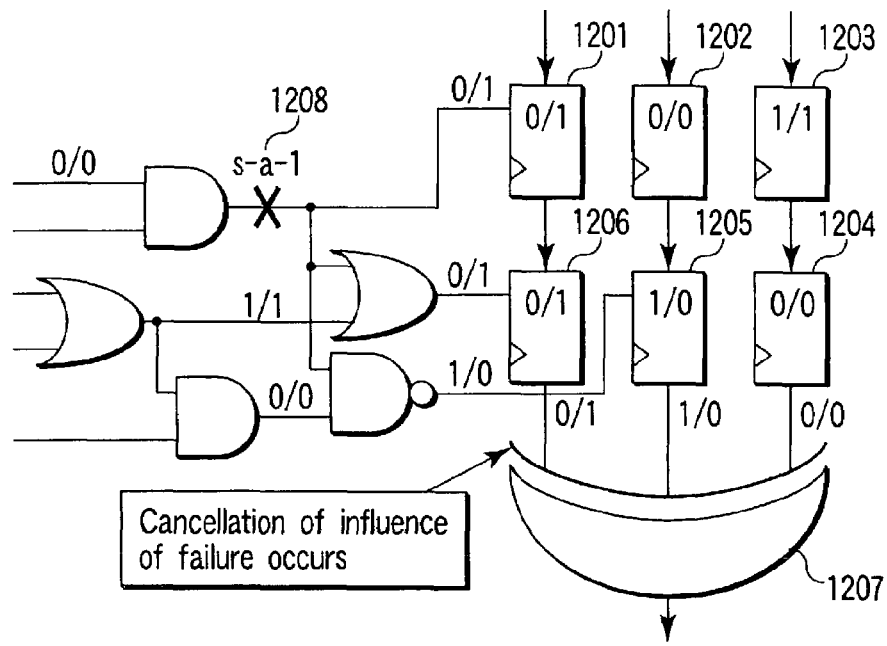
FIG. 13 is a circuit diagram showing a state in which an influence of a failure by an XOR gate shown in FIG. 12 is canceled out.

FIG. 13 shows a state in which the influence of the failure by the XOR gate shown in FIG. 12 is canceled out.

For example, an influence of a "1" degeneracy failure 1208 in which the potential of the wiring is fixed to a high level is propagated to scan flip-flops 1201, 1206, 1205. Changes of the logic value by the failure are 0/1, 0/1, 1/0, respectively. The influence of the failure is not propagated to the other scan flip-flops 1202, 1203, 1204.

When scan shift is performed in this state, the data of the scan flip-flops 1204, 1205, 1206 is calculated by an XOR gate 1207. As a result, the influences 1/0 and 0/1 of the failures of the scan flip-flops 1205, 1206 cancel each other.

On the other hand, even when the data of the scan flip-flops 1201, 1202, 1203 is calculated by the XOR gate 1207, the result is 1/0, and the failure is detected. This problem can be avoided by changing the constitution of the scan chain.

Figure 14:
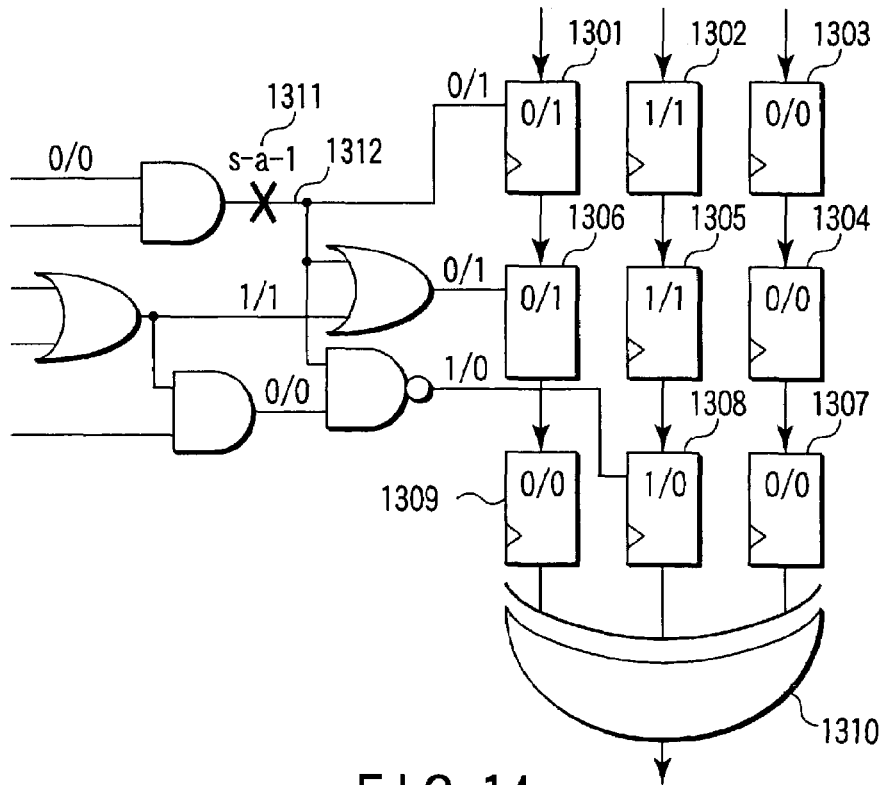
FIG. 14 is a circuit diagram showing an example in which a problem of cancel-out of the influence of the failure is avoided by re-constituting the scan chain shown in FIG. 13.

FIG. 14 shows an example in which a problem of cancel-out of the influences of the failure is avoided by re-constituting the scan chain shown of FIG. 13.

The positions of the scan chains of scan flip-flops 1301, 1306, 1308 influenced by the same failure are constituted to deviate by one bit.

As a result, the influence of the failure owned by the scan flip-flops 1301, 1306, 1308 simultaneously influenced by a degeneracy failure 1311 is not simultaneously calculated by an XOR gate 1310. In this scan chain, a result of XOR calculation of scan flip-flops 1307, 1308, 1309 is 1/0, result of scan flip-flops 1304, 1305, 1306 is 1/0, and result of scan flip-flops 1301, 1302, 1303 is 1/0. It is seen that the influence of the failure is not canceled out.

Figure 15:
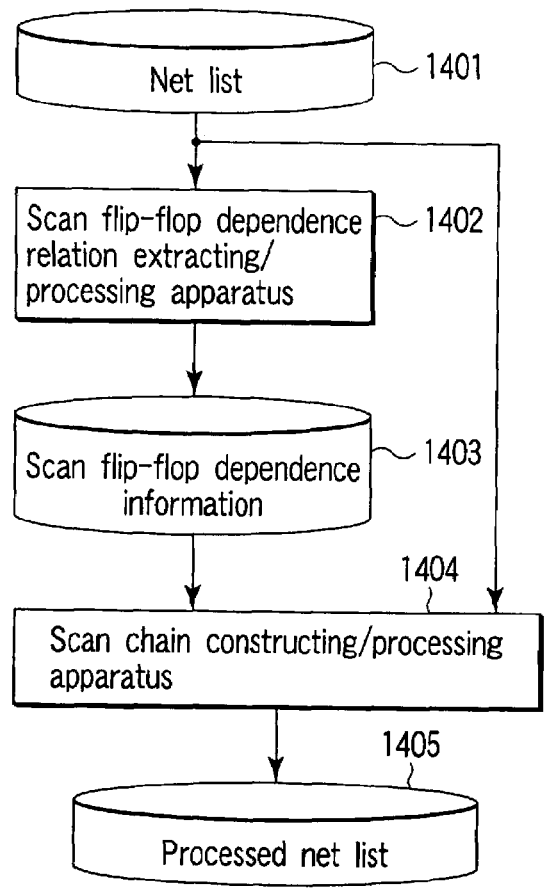
FIG. 15 is a diagram showing a whole constitution of a design support apparatus according to a fourth embodiment, which constitutes a logic BIST circuit including the scan chain shown in FIG. 14.

FIG. 15 shows a whole constitution of the design support apparatus according to a fourth embodiment, which constitutes the logic BIST circuit including the scan chain shown in FIG. 14.

This design support apparatus is roughly constituted of a scan flip-flop dependence relationship extracting/processing apparatus 1402 and scan chain constructing/processing apparatus 1404.

The scan flip-flop dependence relationship extracting/processing apparatus 1402 reads a net list 1401, lists up the scan flip-flops influenced by the signal line from the net list, and outputs scan flip-flop dependence information 1403. The scan chain constructing/processing apparatus 1404 reads the scan flip-flops dependence information 1403 and net list 1401, and constructs the scan chain in which the data simultaneously influenced by the failure is not supplied to the XOR gate.

In this processing, either before or after the scan chain is extended, arrangement wiring information is also used to construct the scan chain, and an optimum result is thereby obtained.

According to the logic design support apparatus according to the fourth embodiment, the scan chain is constructed so that the data influenced by the failure is not simultaneously supplied to one XOR gate. Therefore, when the XOR gate is used to constitute the circuit for reducing the number of wirings, the data influenced by the failure can be prevented from being canceled.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A semiconductor integrated circuit having a self-testing circuit, said semiconductor integrated circuit comprising:
    the self-testing circuit including a test circuit which is incorporated in a logic circuit to test the logic circuit and which comprises a test pattern generator to generate a test pattern supplied to the logic circuit and a compressor to compress a test result output from the logic circuit and in which the logic circuit comprises a plurality of scan chains including a plurality of serial connected registers and the compressor comprises a through output portion to directly output the test result output from the logic circuit;
    a pattern counter which counts the test pattern at a test time of the logic circuit;
    a shift counter which counts the number of shifts in the scan chain in the logic circuit at the test time of the logic circuit; and
    a failure information output circuit which is connected to the test circuit and which outputs step information of the test pattern corresponding to a failure to an integrated circuit external terminal when the failure is detected at the test time of the logic circuit and which outputs count signals of the pattern counter and shift counter at the detection time of the failure to the outside of the semiconductor integrated circuit, wherein the failure information output circuit comprises,
    a comparison circuit which compares a signal passed through the compressor with an expected value for each test pattern and which outputs a failure flag at a mismatch time,
    a first external terminal which outputs the failure flag supplied from the comparison circuit to the outside of the semiconductor integrated circuit.
    a second external terminal which receives the failure flag and subsequently outputs the pattern count signal supplied from the pattern counter to the outside of the semiconductor integrated circuit, and
    a third external terminal which outputs the shift count signal supplied from the shift counter to the outside of the semiconductor integrated circuit.

2. The circuit according to claim 1, wherein the failure flag has a bit width of the expected value.

3. The circuit according to claim 2, further comprising:
    a gate circuit which is connected to the comparison circuit and which reduces the number of bits of the failure flag output from the comparison circuit and whose output end is connected to the pattern counter and shift counter.

4. The circuit according to claim 1, further comprising:
    a plurality of selectors which are connected between the compressor and comparison circuit and which sets the number of output signals of the compressor to be smaller than the number of scan chains of the logic circuit.

5. The circuit according to claim 1, further comprising:
    a selector which is connected between the compressor and comparison circuit and which reduces the number of signals output from the compressor,
    the selector circuit including:
        a plurality of XORs connected to the output end of the compressor;
        a plurality of first selectors which are connected to the output end of the compressor and which select an output signal of the compressor in response to a first select signal; and
        a plurality of second selectors which have first and second input ends and output end connected to the comparison circuit, the first input end of each second selector being connected to the output end of the corresponding XOR, the second input end being connected to the output end of the corresponding first selector and each of which selects one of an output signal of the corresponding XOR and output signal of the corresponding first selector in response to a second select signal.

6. The apparatus according to claim 5, wherein in the plurality of scan chains connected to the XOR, a plurality of serial connected registers constituting each scan chain hold data indicating an influence of failure of the logic circuit in a potential in which the data is not simultaneously supplied to the XOR.

7. A method of self-testing a logic circuit mounted on a semiconductor integrated circuit, comprising:

supplying a test pattern to the logic circuit to count the number of test patterns, the logic circuit comprising a scan chain in which a plurality of registers are connected in series;

comparing compressed data output from the logic circuit with an expected value corresponding to the test pattern;

outputting the number of test patterns at a mismatch time as a first failure log to a tester outside the semiconductor integrated circuit, when the data disagrees with the expected value as a result of comparison;

obtaining a failure pattern and expected value in accordance with the first failure log;

supplying the failure pattern as the test pattern to the logic circuit to count the number of test patterns;

shifting the test pattern to the plurality of registers of the scan chain to count the number of shifts;

comparing data output from the logic circuit with the expected value corresponding to the test pattern for each shift;

outputting a failure flag and the number of shifts as a second failure log to the tester outside the semiconductor integrated circuit, when the data disagrees with the expected value as a result of the comparison; and detecting a failure based on the second failure log by the tester.

8. A method of self-testing a logic circuit mounted on a semiconductor integrated circuit, comprising:

supplying a test pattern to the logic circuit to count the number of test patterns, the logic circuit comprising a scan chain in which a plurality of registers are connected in series;

shifting the test pattern to the plurality of registers of the scan chain to count the number of shifts;

comparing data output from the logic circuit with the expected value corresponding to the test pattern, the data output from the logic circuit being passed through XOR;

outputting a failure flag, the number of test patterns at a mismatch time, and the number of shifts as a first failure log to a tester outside the semiconductor integrated circuit, when the data disagrees with the expected value as a result of comparison;

obtaining a failure pattern, expected value, and XOR to which the failure scan chain belongs in accordance with the first failure log;

supplying the failure pattern as the test pattern to the logic circuit to count the number of test patterns;

shifting the test pattern to the plurality of registers of the scan chain to count the number of shifts;

comparing data output from the logic circuit with the expected value corresponding to the test pattern for each shift, the data output from the logic circuit being passed through the failure scan chain to which the obtained XOR belongs;

outputting the failure flag and the number of shifts as a second failure log to the tester outside the semiconductor integrated circuit, when the data disagrees with the expected value as a result of the comparison; and detecting a failure based on the second failure log by the tester.

* * * * *